(12) United States Patent
Kuznicki et al.

(10) Patent No.: US 10,971,642 B2
(45) Date of Patent: Apr. 6, 2021

(54) OPTO-ELECTRONIC UNIT COMPOSED OF AN OPTO-PHOTONIC PLATFORM

(71) Applicant: SEGTON ADVANCED TECHNOLOGY, Versailles (FR)

(72) Inventors: Zbigniew Kuznicki, Hoenheim (FR); Patrick Meyrueis, Strasbourg (FR)

(73) Assignee: SEGTON ADVANCED TECHNOLOGY, Versailles (FR)

( * ) Notice: Subject to any disclaimer, the term of this patent is extended or adjusted under 35 U.S.C. 154(b) by 0 days.

(21) Appl. No.: 14/912,619

(22) PCT Filed: Aug. 20, 2014

(86) PCT No.: PCT/IB2014/002493
§ 371 (c)(1),
(2) Date: Feb. 18, 2016

(87) PCT Pub. No.: WO2015/025224
PCT Pub. Date: Feb. 26, 2015

(65) Prior Publication Data
US 2016/0204294 A1    Jul. 14, 2016

Related U.S. Application Data

(60) Provisional application No. 61/867,647, filed on Aug. 20, 2013.

(51) Int. Cl.
*H01L 31/055* (2014.01)
*H01L 31/054* (2014.01)

(52) U.S. Cl.
CPC ........ *H01L 31/055* (2013.01); *H01L 31/0549* (2014.12); *Y02E 10/52* (2013.01)

(58) Field of Classification Search
CPC .......................... H01L 31/055; H01L 31/0549
See application file for complete search history.

(56) References Cited

U.S. PATENT DOCUMENTS

| 4,506,949 A | 3/1985 | Knop |
| 5,048,925 A * | 9/1991 | Gerritsen ............. G02B 5/1814 |
| | | 359/566 |

(Continued)

FOREIGN PATENT DOCUMENTS

| JP | 201338323 | 2/2013 | |
| JP | 2013038323 A * | 2/2013 | ........... H01L 31/052 |

(Continued)

OTHER PUBLICATIONS

Beard et al., "Multiple Exciton Generation in Colloidal Silicon Nanocrystals", 2007, Nano Letters, vol. 7, No. 8, pp. 2506-2512. (Year: 2007).*

(Continued)

*Primary Examiner* — Daniel P Malley, Jr.
(74) *Attorney, Agent, or Firm* — Seckel IP, PLLC

(57) ABSTRACT

The solar photovoltaic photoconverter unit (1) comprises a light processing opto-photonic platform (2) realized by at least one transparent substrate (8) is having on, at least one, of its faces a digital diffractive grating constituted by slanted ribs (11) that are modulated to harvest a maximum of solar light at any angle of incidence to split it into several spectral sub-bands, to guide and to concentrate individually every one of these spectral sub-band, toward a separate output of the opto-photonic platform (2) for allowing its exploitation by a light-to-electricity conversion unit (3) that will have by optimization a grate overall conversion efficiency. The opto-photonic platform (2) also includes photonic converters (13) and (14) converting ultraviolet light into visible light and also infrared light in visible light for a better exploitation of the energy present in the solar light and so increasing the light to electricity conversion. The solar photovoltaic photoconverter unit (1) comprises also a light-to-electricity converter unit (3).

20 Claims, 5 Drawing Sheets

(56) References Cited

U.S. PATENT DOCUMENTS

| | | | |
|---|---|---|---|
| 9,547,181 B2 | 1/2017 | Yang et al. | |
| 9,711,674 B2 | 7/2017 | Kuznicki et al. | |
| 2007/0146910 A1* | 6/2007 | Duston | G02F 1/13471 359/834 |
| 2007/0277869 A1* | 12/2007 | Shan | G02B 5/045 136/246 |
| 2008/0048102 A1* | 2/2008 | Kurtz | H01L 31/0547 250/226 |
| 2009/0095341 A1* | 4/2009 | Pfenninger | H01L 31/048 136/246 |
| 2010/0203364 A1* | 8/2010 | Fortmann | H01G 9/2004 429/7 |
| 2011/0162700 A1 | 7/2011 | Kuznicki et al. | |
| 2013/0016431 A1* | 1/2013 | Taudien | F24S 23/31 359/615 |
| 2014/0198380 A1 | 7/2014 | Pesala | |
| 2014/0293422 A1 | 10/2014 | Yang et al. | |

FOREIGN PATENT DOCUMENTS

| | | |
|---|---|---|
| WO | 2010089624 A1 | 8/2010 |
| WO | 2013/005231 A2 | 1/2013 |
| WO | WO 2013003204 | 1/2013 |
| WO | WO 2013005231 | 1/2013 |

OTHER PUBLICATIONS

English machine translation of Kawai (JP 2013/038323 A) provided by the EPO. (Year: 2018).*

Synthesis and Characterization of Discrete Luminescent Erbuim-Doped Silicon Nanocrystals Journal of American Chemical Society, vol. 121, pp. 1888-1892, Feb. 19, 1999 John St. John et al.

International Search Report dated Mar. 19, 2015 in corresponding application No. PCT/IB2014/002493 (4 pages).

International Preliminary Report on Patentability dated Feb. 23, 2016 in corresponding application No. PCT/IB2014/002493 (8 pages).

St. John et al., "Synthesis and Characterization of Discrete Luminescent Erbium-Doped Silicon Nanocrystals", Journal American Chemical Society, vol. 121, 1999, pp. 1888-1892.

EP Office Action dated Oct. 12, 2018 in corresponding application No. EP14827859.1; in English (6 pages).

EP Office Action dated Oct. 18, 2019 in corresponding application No. EP14827859.1; in English (5 pages).

European Office Action dated Oct. 8, 2019 in counterpart application No. EP14827859.1 (in English; total 5 pages).

Raulot, Victorien, "Methods of conception and fabrication of imaging devices in diffraction optics having sub-wavelength structures", Thesis, Strasbourg University, Strasbourg, France, Sep. 29, 2011, 169 pages (with English machine translation; total 339 pages).

* cited by examiner

OPTO-ELECTRONIC UNIT COMPOSED OF AN OPTO-PHOTONIC PLATFORM

DEFINITION OF THE INVENTION

The invention is an opto-electronic unit built of an opto-photonic platform of light processing, one or several photonic converters and one but more often several light-to-electricity converters.

The opto-photonic platform contains at least one planar substrate with at least one micro- or nano-structured face, forming a diffractive grating with inclined ribs and with modular characteristics to decompose a light spectrum into spectral sub-bands regardless of its incidence. The spectral sub-bands of the incident light thus divided are processed and each one directed to an assigned surface of a dedicated light-to-electricity converter configured to have the highest possible conversion efficiency.

The optical part of the opto-photonic platform is a selective micro- or nano-structured diffractive system for a concentration effect. It is complemented by two photonic converters for converting ultraviolet radiation and infrared radiation into visible spectral sub-bands each of them directed downstream onto the dedicated light-to-electricity converter with an optimum performance for each emerging spectral sub-band.

The assembly is then formed of an opto-photonic platform for the light processing, and a light-to-electricity conversion unit formed of one or more light-to-electricity converter(s) to obtain a high performance photovoltaic device.

The opto-photonic platform substantially harvests and concentrates all spectral components or sub-bands of visible and invisible incident solar radiation, and then guides them to the associated light-to-electricity converters to convert the largest possible amount of incident photon energy and thus to obtain the highest possible overall yield.

PROBLEM SOLVED

The production of electrical energy by photovoltaic sensors currently available on the market is relatively small mainly because of their modest efficiency but also because their fixed position relative to the sun whose constant motion induces losses from angular maladjustment.

The overall yield of these conventional photovoltaic cells is greatest when their front face is perpendicularly exposed to the sun. However, the inclination of the sun is continuously variable throughout the time of day and the season. Even if a location for the sensors is chosen so that they receive solar radiation as long as possible, a large part of this radiation cannot be converted to electricity during the day due to the inflexibility of these sensors and a more or less "grazing reflection" of incident rays.

The problem arises when solar radiation is low on the horizon or diffused, when the sky is overcast or when solar radiation is attenuated by suspended aerosols or diffused by clouds including those at high altitude or when the radiation reaches sensors indirectly. In these cases, the amount of electricity generated is small because a large portion of photon energy of the solar radiation is lost to conversion.

The low yield of present-day photovoltaics is of the order of 10-20%. The modest nature of this performance also comes about in another way.

Solar light covers a broad spectrum, consisting of many spectral sub-bands containing a variety of wavelengths and thus of different photon energies, which cannot all be converted to electricity in the same manner.

For any present-day converter to produce photovoltaic electricity the energy provided by the photons of the incident solar radiation must be sufficient to release electrons.

The fundamental condition that is well-known by scientists is that the conversion appears when the energy of incident photons is above the forbidden bandgap of the semiconductor material forming photovoltaic converter. Then electrons can be released and appear as an electric current.

Therefore, the spectral components or spectral sub-bands having photonic energy less than the band gap energy of the semiconductor material forming the photovoltaic converter cannot release electrons.

On the other hand, the radiation of spectral sub-bands whose photonic energy is greater than the band gap of the semiconductor material of the photovoltaic converter releases the same number of electrons as those photons with energy corresponding exactly to the bandgap energy. The additional energy of the photons of these high energy spectral bands is not available to release additional electrons.

Furthermore, if the visible part of the incident solar radiation is used at least partially by today's photovoltaic converters, the energy of infrared spectral sub-bands is not converted at all, so that the energy of ultraviolet sub-bands is poorly converted into electricity and therefore they bring a lot of heat which is harmful for the sensor and related installation.

Thus, most of the photon energy provided by incident solar radiation is lost which explains the modest performance of existing sensors qualified as photovoltaic.

The opto-photonics platform converts spectrally ultraviolet and infrared radiations, splits whole the incident solar radiation and directs it through spectral sub-bands onto light-to-electricity converters optimized for each of the spectral sub-bands, which gives this new photovoltaic sensor a much higher overall yield.

PRIOR STATE OF THE ART

In an attempt to remedy the low efficiency of the prior state of the art, it has been proposed to mount these early photovoltaic converters on sun tracking systems that orient them as long as possible during the day to keep them fully exposed to the sun.

These tracking systems make it possible to increase the amount of energy produced by the photovoltaic converters, but at the expense of several disadvantages. The tracking systems are complex, difficult to install and maintain, fragile and quite expensive mainly due to their movable mechanisms.

There are also static devices intended to concentrate solar energy. However these devices are cumbersome and require large sensing surfaces which limit installation possibilities on roofs of homes.

Lenses have also been used to concentrate solar radiation onto photovoltaic converters for example sets of several juxtaposed convergent lenses but they do not recover more energy then it falls upon them. These systems are used mainly to heat water.

The present invention concentrates sunlight by specific optimized diffractive digital gratings. The diffractive optics was first performed by analog means, exploiting the resources of holography, following principles that earned a Nobel Prize in 1971 for Dennis Gabor. But if this analog approach constitutes proof of diffractive optics for shaping wave fronts, especially for solar applications, its performances are limited. Also, the diffractive components obtained are not reproducible in large series.

Diffractive optics having become digital, since the mid-80s, it has expanded the applicability to the field of the solar energy, but with two drawbacks:
the scalar modeling lessens a very little opportunity to move away from an optical axis of symmetry,
the pattern duplication could only be made with plastics.

The appearance of diffractive techniques making use of fringes has increased performance in the area of sunlight through new theoretical possibilities. Difficulties in fabricating the fringed diffractive components that require specific techniques and special expensive machines have limited expected benefits. So, this technology has never been developed on a large scale.

SHORT DESCRIPTION OF THE INVENTION

The opto electronic unit comprises an opto-photonic platform for light processing taking the form of a transparent support that may be a planar form and be realized out of a transparent dielectric material having a network of diffractive concentrators with optical digital ribs or a slant and modulated fringes to collect a maximum of solar light regardless of its incidence. It splits the incident light into several spectral sub-bands and rearranges the spectral sub-bands that are ineffective or thermally harmful in spectral sub-bands of optimal efficiency. Next, it guides and individually focuses each spectral sub-band on a receiving area of the front face of an associated light-to-electricity converter. The given converter is optimized for the spectral sub-band. The whole system forms a photovoltaic sensor of the high performance.

The opto-photonic platform includes means for converting ultraviolet and infrared radiations into visible radiation and at least one light-to-electricity converter. This allows better exploiting of the solar spectrum by increasing the overall efficiency of the light-to-electricity conversion.

Thus, the opto-photonics platform is a diffractive digital concentrator that is associated with at least two photonic converters. One converts ultraviolet radiation and the other the infrared radiation into spectral sub-bands: visible or near-infrared. So, that each light-to-electricity converter receiving a spectral sub-band radiation reaches a good efficiency Digital diffractive micro- or nano-structures of the opto-photonics platform fulfill different functions of solar light treatment. They decompose the incident light into a plurality of spectral sub-bands, each corresponding to a selected spectral band of limited width and guide each of these spectral sub-bands independently of one another and concentrate them on specific output area of the opto-photonics platform. The spectral sub-bands are then projected as a light spot with the shape, size and position corresponding to the surface of the assigned light-to-electricity converter that is suitable interposed on the path of the light beam.

The incoming light is then treated in the way to produce the maximum power from the solar energy. This is factual for each spectral sub-band component of solar light, visible and invisible independently on the solar light incidence on the platform. All these integrated functions lead to an efficiency exceeding that of the currently installed solar panels.

ADVANTAGES OF THE INVENTION

The opto-photonic unit as described in the invention is a purely optical device that allows taking into account the totality of the light harvesting and the light concentration functions concerning the totality of the sun radiation belonging to the visible and non-visible spectrum with any angle of incidence and even in the case of diffuse and attenuated light without the inconvenients of the previously employed photovoltaic devices.

This is for the part of diffraction network of a planar device, static and little bulky, designed as a planar support of one or more dielectric layers or films of an organic or inorganic material, transparent for the light, which has, at least at one surface, a modulated array of digital diffractive micro- or nano-structures.

These micro- or nano-structures are in the form of many inclined ribs forming an elementary pattern. They are defined by dedicated software and repeated over the entire exposed surface of the light-to-electricity converter.

The opto-photonic platform with its photonic converter(s) is placed before or attached to, or integral with, an associated unit of the light-to-electricity conversion. The resulting system is a planar sensor insensitive either on the incidence of the solar light radiation or of reduced intensity, or of a low inclination. The area of a solar panel installation is reduced for the same installed power.

The idea of a solar concentrator that splits the incident solar beam, its visible and invisible parts, i.e., whole incident solar light into spectral sub-bands and especially integrates usefully the spectral conversion of not processed or poorly processed components of light brings many benefits The light-to-electricity converters placed under the opto-photonic platform are receiving a light of specific spectral sub-bands being each adapted and optimized for high-yield conversion of spectral sub-band intended for it.

Particularly, the opto-photonic platform separates from the rest of the solar radiation the spectral sub-bands corresponding to the infrared and ultraviolet and converts them spectrally. This characteristic brings a significant improvement because the ultraviolet band is normally absorbed very close of the surface of the photoconverter and, because of that, cannot be converted correctly into electricity. The electrons that are thus produced, recombine rapidly with holes through the surface recombination states without producing any electric current.

Spectral conversions of ultraviolet and infrared radiations into visible and near-infrared light provide the considerable improvement of the overall conversion efficiency.

The opto-photonic platform processes the infrared and ultraviolet radiations by converting them mostly into electricity instead of leaving them go through without any light-matter interaction or to heat uselessly, see dangerously light-to-electricity converter(s) with the attendant disadvantages.

The opto-photonic platform integrates in a compact and static system all functions of optical and photonic processing of the solar radiation that necessary for a complete and efficient use by the light-to-electricity converters downstream leading to a substantial increase in the overall efficiency of the solar sensor.

Despite the large number of functions performed, the opto-photonic platform of the invention remains planar and not bulky and the cost of industrial production remains reasonable. It is put appropriately in direct interaction with the unit of the light-to-electricity conversion associated with it.

The complete solar sensor, formed by the arrangement of an opto-photonic platform and related light-to-electricity converters, placed below, presents an optimal performance well above that of light-to-electricity converters operating alone and especially that of said photovoltaic sensors of the prior art.

DESCRIPTION OF THE FIGURES

The understanding of the following description is facilitated by reference to the figures which are listed in detail below.

DETAILED DESCRIPTION OF THE INVENTION

Figure 1:
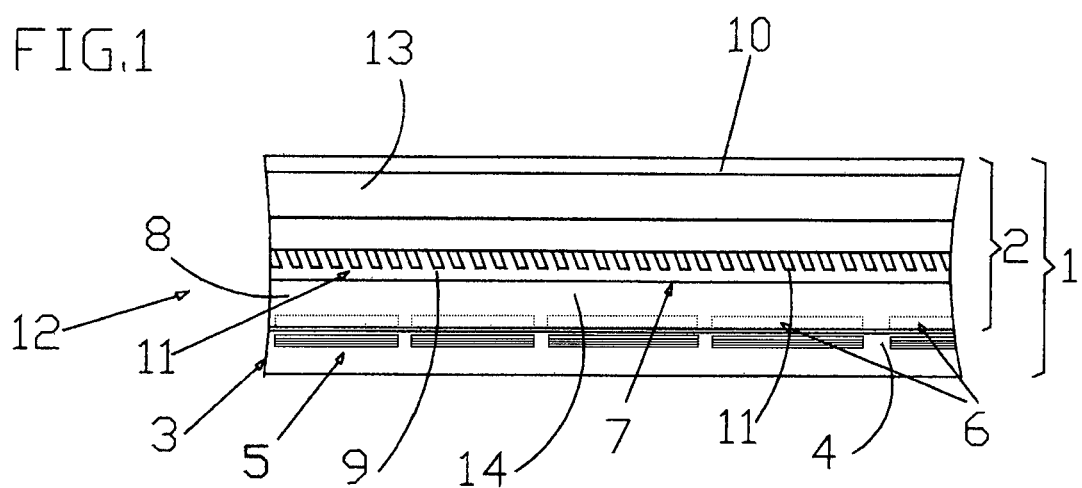
FIG. 1 is a schematic cross-sectional view of a length portion of a first embodiment of the opto-photonic platform for the light processing placed on a light-to-electricity converter to form a solar photoconverter unit of high performance according to the invention.
Figure 2:
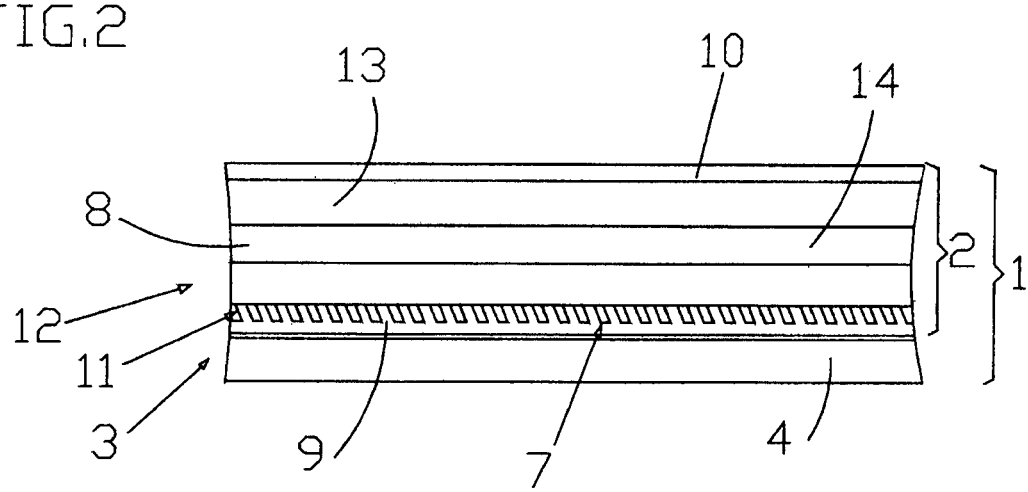
FIG. 2 is a cross-sectional view of a length portion of a second embodiment of the opto-photonic unit of light processing placed on a light-to-electricity converter to form a unit of high efficiency solar collector according to the invention.
Figure 3:
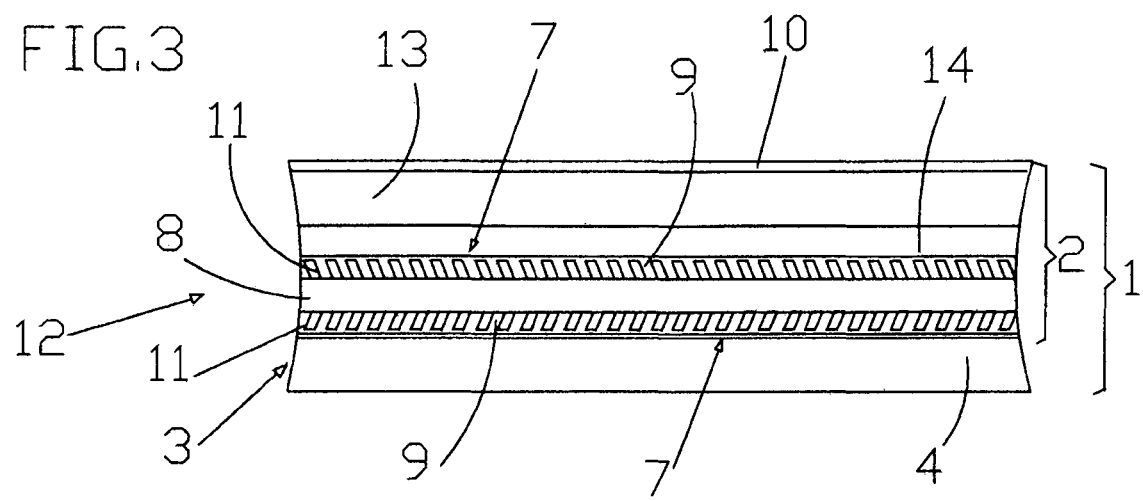
FIG. 3 is a schematic cross-sectional view of a length portion of a third embodiment of the opto-photonic platform with diffractive micro- or nano-structures double sided that is to say looking upwards and downwards to form a unit of high efficiency solar sensor according to the invention.

FIG. 1 shows schematically a solar sensor 1 with its photoconversion components. The solar sensor 1 is formed by an opto-photonic platform 2 mounted, placed, or otherwise fixed or secured on a unit 3 of the light-to-electricity conversion, or at a suitable distance therefrom. The light-to-electricity conversion unit 3 receives all incoming solar radiation through the opto-photonic platform 2 directly or after processing, for example, by spectral conversion. This unit comprises one or a plurality of light-to-electricity converters 4 each having an exposure surface 5 on which an incident light flux 6 occurs in the form of limited spectral sub-band(s) and which is (are) intended for a specific output(s) of the opto-photonic platform 2. Each light-to-electricity converter 4 is optimized and adapted to the characteristics of the received spectral sub-band flux.

The opto-photonic platform 2 is the upper part of the solar sensor 1. It forms a compact unit with light-to-electricity conversion 3 unity or is placed as an upper component of the solar sensor before 1 near or on the light-to-electricity conversion unit 3.

The solar sensor 1 is planar and compact. The thicknesses of the supports, tablecloths, films, and layers as well as the different grids of the electrodes are proportionally small.

In one embodiment of the invention, the diffractive micro- or nano-structures 7 are formed as planar transparent support or as a sheet or as a film or as a layer or more layer(s) of transparent detachable or rigid substrate 8 offer better optimized diffraction of the sunlight. These diffractive microstructures or nanostructures 7 are conformed in one or the other, or both faces of the planar support or layer(s) of the substrate 8.

For reason of simplification, we will use hereafter the term "substrate 8" for identifying jointly the transparent substrate and the film or the superposed layers of substrate 8.

In the case of a transparent substrate 8, separate or rigid, it can be realized with an organic or mineral dielectric material that is transparent for light such as glass or an adapted polymer material.

The plastic material has the advantage of being inexpensive, but its lifetime is much shorter than that of glass. When the substrate 8 is made of a plastic material it must be selected so as to be easily replaced if necessary. Furthermore, in order to withstand the heat produced by the energy collected, this material must be selected to spread this energy over a larger surface. It is understood that a glass optical platform will be more sustainable and beneficial in many ways including its ability to withstand heat.

To reduce the overall thickness and volume of the opto-photonic platform 2, the substrate 8 may be of a relatively small thickness but must be mechanically resistant. In a variant, the opto-photonic platform 2 is separated from the light-to-electricity converting unit 3 by means of a transparent intermediate layer, sheet, film or other continuous transparent support or by means of intermediate point fixations (not shown) providing a support on which it rests.

Continuous transparent medium or intermediate microelements ensure the creation of a gap to prevent the decline of the substrate 8 in which are shaped diffractive micro- or nano-structures 7.

In all cases, the diffractive micro- or nano-structures 7 are covered with a transparent protective layer 9 on one or the both sides of the substrate 8 inside which they are formed. It will be appreciated that where these diffractive micro- or nano-structures 7 are present on the front face of the converter 1, it is necessary to protect them especially by a specific protective layer of transparent material 10. The presence of this protection layer on the incident face 10 of the platform is desirable in all cases.

The light-to-electricity conversion unit 3 may be a conventional device as a single converter in the case of conventional solar sensors for example those known under the terminology of photovoltaic cells or a special high efficiency converter including or consisting of a plurality of converters, each of them being designed, optimized and adapted to be associated and cooperate with the opto-photonics platform 2. The solar converter 1 using the opto-photonic platform 2 can have only one unique either classic or specific light-to-electricity converter.

Figure 13:
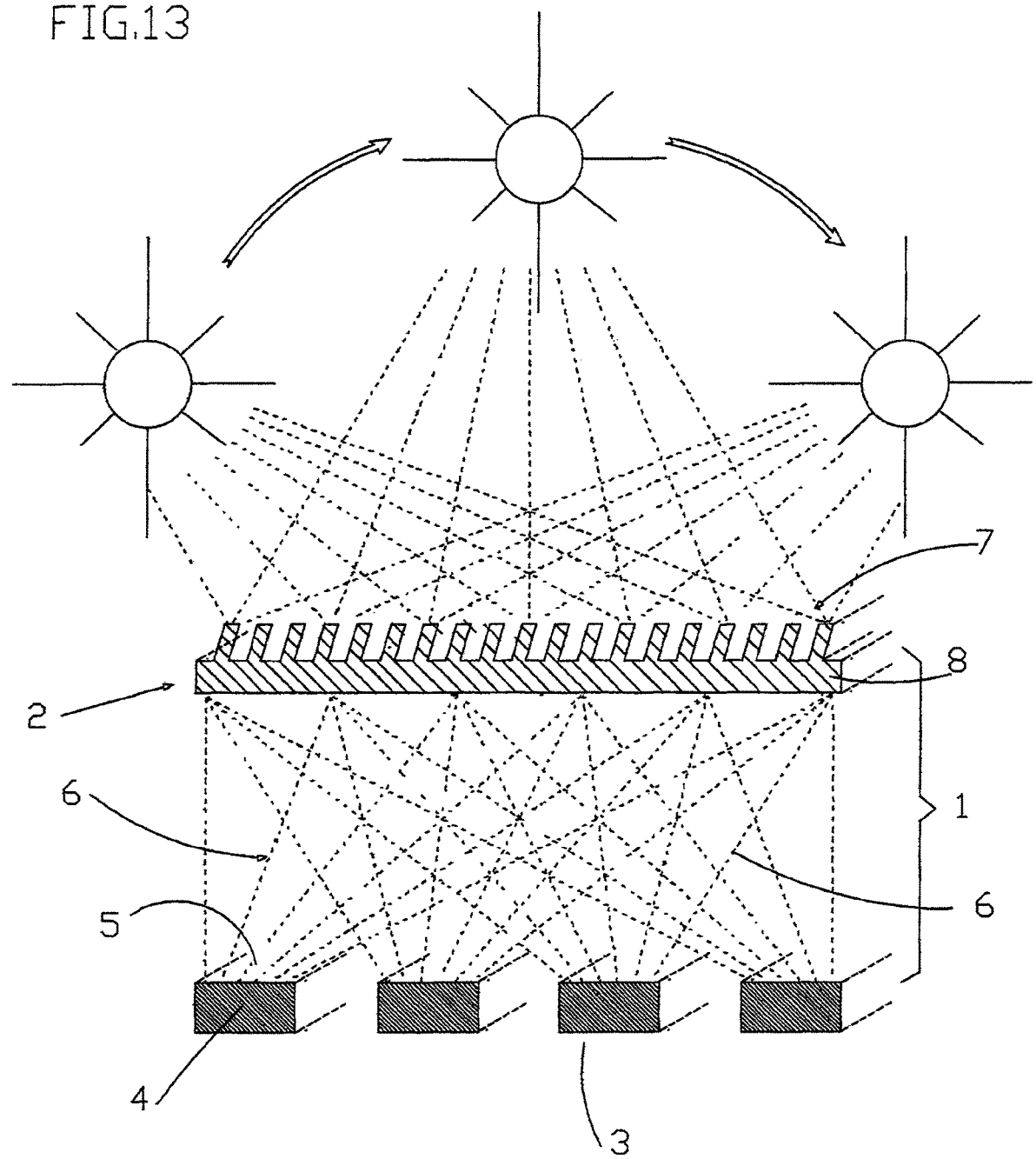
FIG. 13 is a schematic basic view illustrating in a simple way the harvesting, the splitting, the guidance and the concentration of the solar light in the photoconverting device according to the invention.

In FIG. 13 that is not performed to scale, is shown a unit of several light-to-electricity converters 4, for example four, each being specially adapted for its own spectral sub-band from visible that is transferred from the opto-photonic platform 2 and illuminates its appropriately exposed face 5. These light-to-electricity converters 4 may be independent of each other or form together a compact unit on the same mechanical support, or embedded therein.

Each specific light-to-electricity converter 4 is optimized for radiation wavelengths of a spectral sub-band of limited width so as to further increase the overall efficiency. For example, one can cite a spectral sub-band concerning the red, a second spectral sub-band concerning the green and so on.

Figure 4:
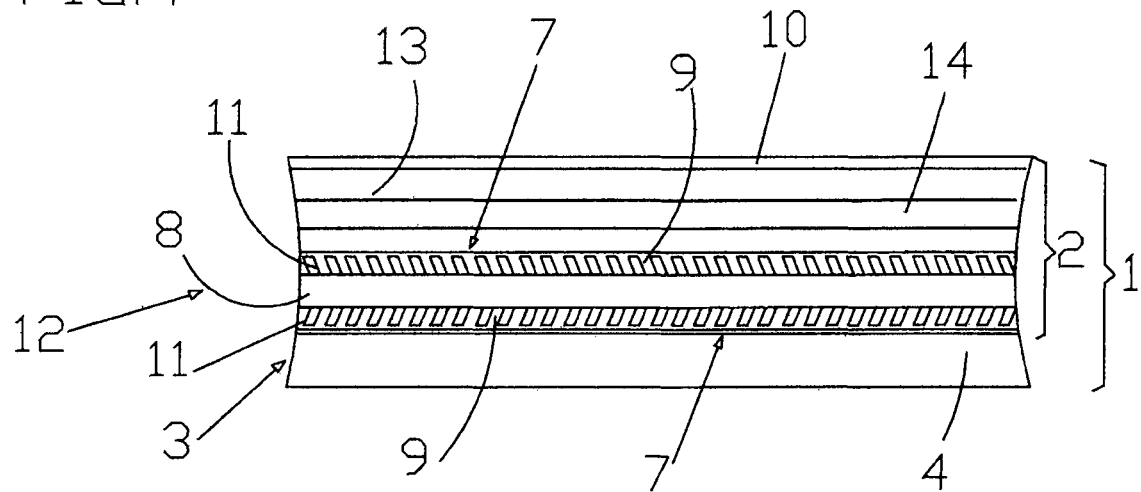
FIG. 4 is a schematic cross-sectional view of a length portion of a fourth embodiment of the opto-photonic platform for light processing that forms two superposed gratings of diffractive micro- or nano-structures, both directed downward, the platform is placed on a light-to-electricity converter to form a unit of high efficiency solar sensor according to the invention.
Figure 5:
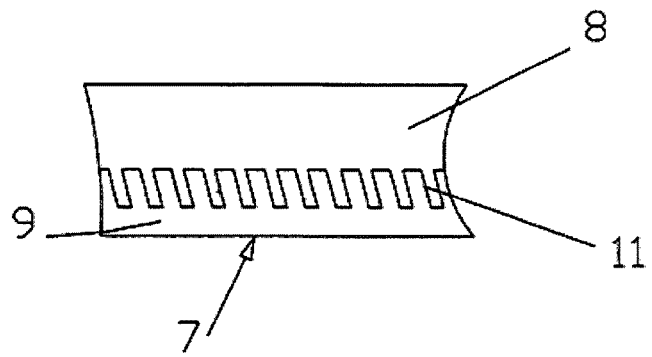
FIG. 5 shows an enlargement of a length portion of diffractive micro- or nano-structures of the unmodulated digital opto-photonic platform forming the solar sensor with one or several light-to-electricity converters according to the invention.

If only one range of micro- or nano-structures 7 is insufficient to obtain all of the functions that the opto-photonic platform 2 has to assume, it can comprise several substrates 8 each having digital diffractive micro- or nano-structures 7 on one or on two of its faces. These substrates 8 are superimposed and in number of two as shown in FIG. 4. Of course, a larger number, for example three or four is possible.

As previously stated, these substrates 8 can be associated directly that is to say with a contact between them, or they can be slightly spaced by intermediary elements or by layers or protection devices of micro- or nano-structures 7.

The digital diffractive micro- or nano-structures 7 are composed of a plurality of ribs or slant fringes 11 several examples are introduced on FIGS. 5 to 12. These slanted ribs 11 constitute a micro- or nano-structuration of the substrate 8 surface. They have very small sizes that can be in the range of a micrometer or one part of a micrometer, for instance one tenth of a micrometer, what is similar to a wavelength of the incident light. So, these slanted features 11 have preferably a height ranging between 0.3 and 3 micrometer and are spaced of 100 and 600 nanometers between two successive ribs. The latter corresponds to the spacing of the diffraction grating.

In sectional views, the inclined ribs 11 resemble elongated strips parallelogram-shaped, with ridges and edges to avoid "noise" artifacts of their small size. These strips are inclined at an angle of between 10° and 15° and preferably close to 15° or equal to 15°. The value of this tilt angle results from several constraints, not only optical, but also related to the manufacture of microstructures, including their micro-etching and or their release.

The inclined ribs 11 are arranged generally in complex networks and form no axis of symmetry. They can form elementary patterns which are repeated over the entire surface of the planar support or substrate layer 8.

The inclined ribs 11 cause light scattering creating optical micro-disturbances, which deflect the path of the photons. This creates interference between the light reflected by the ribs and that reflected by hollows or plans between the ribs.

These micro- or nano-structures 7 are called digital being determined by a dedicated software. They correspond to particular solutions of the Maxwell equations, depending on the various optical functions that one wishes to achieve on the front side of the solar sensor 1. Their digital nature enables the realization of much smaller and thinner micro- or nano-structures 7 than their analog equivalents. It is thus possible to work with much lower variations of refractive index. The splitting of the light spectrum in spectral sub-bands may be thinner and the substrate 8 supporting these micro- or nano-structures 7 can also be made thinner and placed closer to the unit of light-to-electricity conversion 3 to obtain a more compact solar sensor 1.

The slanted gratings 11 are resonant diffractive structures. To reach this result the diffractive grating pitch, that is to say the spacing existing between two close features (minimum feature size) has to be inferior to the minimum wavelength of the light to be processed.

The inclined ribs 11 improve the diffraction efficiency and correct defects of astigmatism. They provide the substrate 8 with a diffractive-concentrating system 12 that optical and photonic functions are introduced here above.

It is possible according to the invention a subwavelength diffractive grating 12 including the performances of said resonant optics.

The inclination of the ribs 11, and their resonant properties give features approaching those of photonic crystals, but can advantageously be applied to a polychromatic light such as that of the sun and not only to a narrow wavelength band.

This provides the significantly greater efficiency in the light processing with much less loss and a treatment compatible with polychromatic light such as solar radiation.

The slanted ribs 11 form a gradient of refractive index intermediate between the index of the air which is close to 1 and that of the material constituting the light-to-electricity conversion unit 3 that is for example included for the silicon between 3 and 6. These slanted ribs 11 thus provide a smooth transition between the two materials that make that the whole incident solar radiation, even of low inclination, is absorbed by the opto-photonic platform 2 and the reflection phenomena are highly reduced.

The opto-photonics platform 2 can fulfill its function in this way with its collection function of the maximum luminous flux regardless of its inclination and intensity. Furthermore, there is advantageously no need of an additional antireflection layer reducing the reflection of sunlight as the inclined ribs 11 fulfill this function simultaneously as explained above.

The slanted ribs 11 are modulated in order to process a polychromatic radiation such as sunlight. By these, local modulation zones are specifically created to adapt them to each wavelength of the incident radiation. Several different modulations are possible and non-limiting examples of such modulations are shown and illustrated by way of example in FIGS. 6-9.

Figure 6:
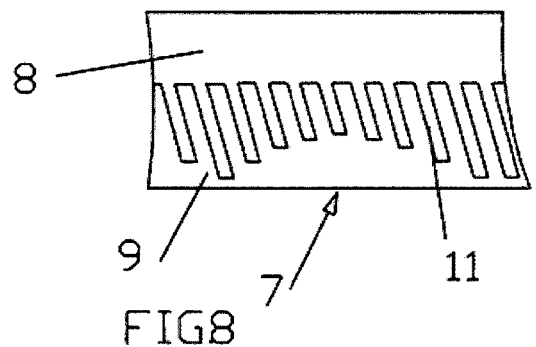
FIGS. 6 to 9 are various views of diffractive structures of the opto-photonic platform corresponding to several variants of modulation.

FIG. 6 shows a modulation of the height of the slanted ribs 11. Such a modulation is quite difficult to achieve from a technical point of view, but it brings additional benefits for anti-reflective properties of the opto-photonic platform 2.

Figure 7:
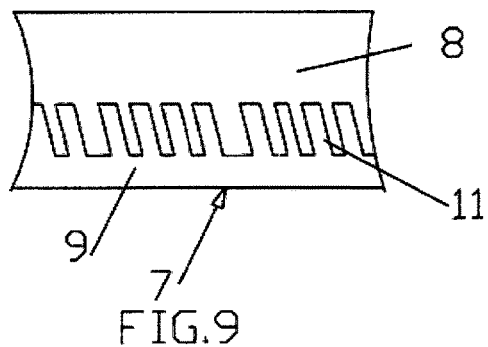

FIG. 7 corresponds to a thickness modulation of the slanted ribs 11.

Figure 8:
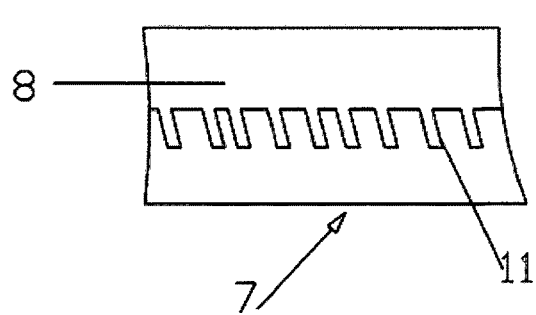

In FIG. 8, the slanted ribs 11 are modulated in spacing or position. This spacing should however remain below the minimum wavelength of the radiation to retain the resonant characteristics of the gratings.

Figure 9:
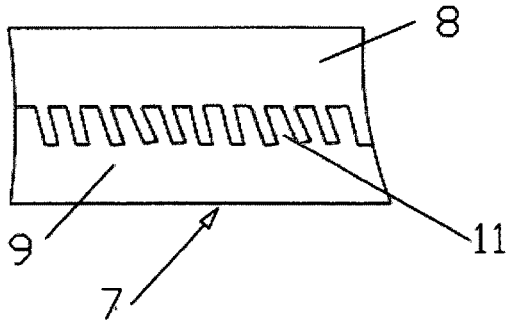
Figure 10:
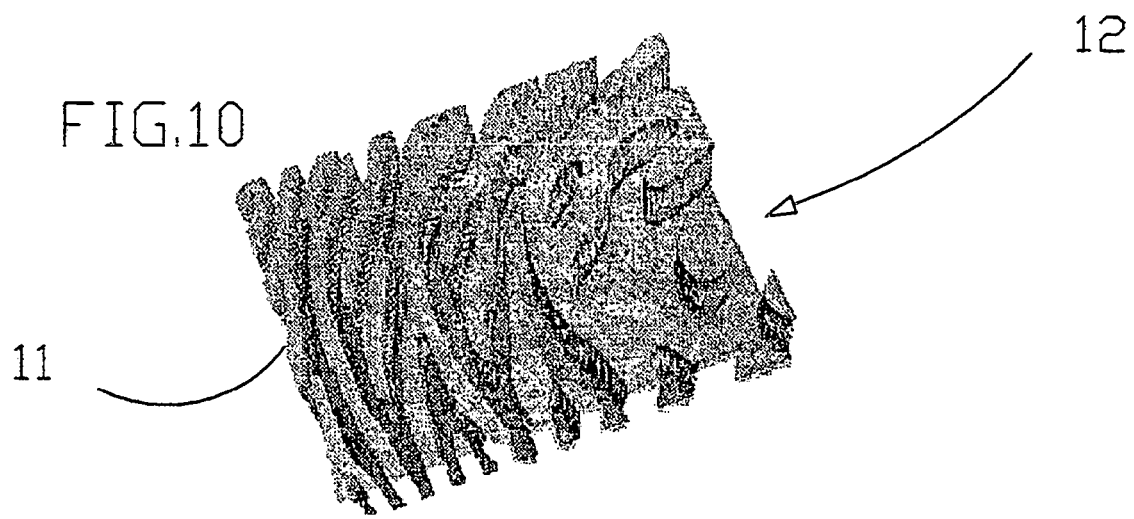
FIGS. 10 to 12 are partial top views of three exemplary diffractive structures that can be used for digital opto-photonic platform forming a solar sensor with one or several light-to-electricity converters according to the invention.
Figure 11:
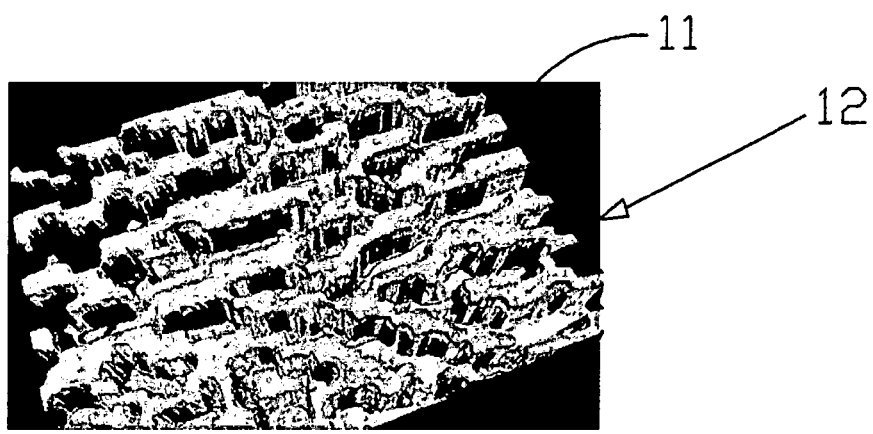
Figure 12:
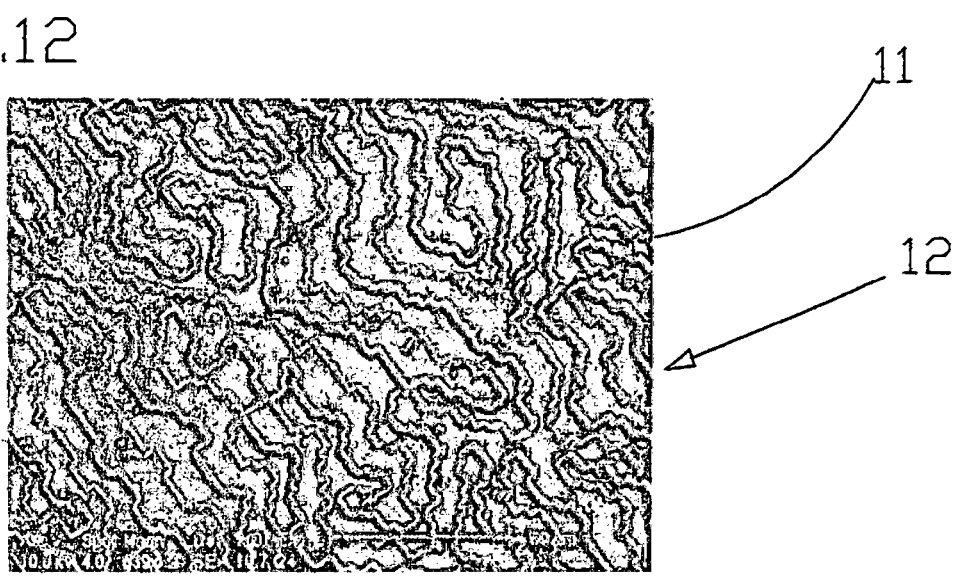

FIG. 9 illustrates an angle modulation of slanted ribs 11. These different angles have values preferably between 10 and 15°.

One can imagine all sorts of modulations including single and combination of variants obtained by combining modulations of phases and/or amplitudes.

Many other types of modulation can be imagined by men skilled in the art without departing from the scope of the invention. Moreover, according to embodiments of the invention, these modulations may or may not be repetitive, increasing, increasing and decreasing, etc. In addition, two or more of these modulations may be alternated or combined between them.

The slanted ribs 11 induce micro modulation of the refractive index at the surface of the opto-photonic platform 2, and the different optical paths for different wavelengths of the solar radiation. It is thus possible to separate the spectral components of the solar radiation in spectral sub-bands and to guide them independently of each other even with a small geometrical difference and even if the sunlight incident angle is changing with the sun displacement.

Once separated, the different spectral sub-bands of the visible and non-visible components of the solar radiation are concentrated and guided for each of them toward an independent output of the opto-photonic platform 2, having a limited spectral band width, a selected location, size and shape to be projected toward the outside light spots, on the exposure surface 5 of a light-to-electricity converter 4 of conversion unit 3.

These resulting light spots may have any shape, different from those of a "point" for example simple and regular geometric forms. This avoids the formation of hot zones within one or several light-to-electricity conversion unit 3 light-to-electricity converters, which has the effect of increasing their lifetime. According to a preferred embodiment of the opto-photonic platform 2, the incident solar radiation can be divided into for example three, four, five or more of spectral sub-bands corresponding to red, yellow, green, blue etc.

For the manufacture of these diffractive micro- or nano-structures 7 can be used for example, well-known techniques of micro- or nano-lithography, duplication on glass or plastic.

For this purpose it is necessary to start engrave the features that are constituted by the slanted gratings 11 on a silicon or quartz master. Is then carried out a molding of these nanostructures in a hard material, such as nickel for instance, and then it is used as a molding master for duplicating the features on glass when this is possible or polymer constituting the substrate 8 of the opto-photonic platform 2. This last duplication step can be carried out economically at an industrial large scale, by a conventional injection molding technique or by means of embossing techniques.

The opto-photonics platform 2 also comprises a mean or several means for photonic conversion 13 of the ultraviolet into the radiation belonging to the visible range which are then much more efficiently processed by the unit 3 of the light-to-electricity conversion unit associated therewith.

Ultraviolet being, by its characteristics, very quickly absorbed, the photonic conversion unit is positioned above the substrate 8 that have the diffractive micro- or nano-structures 7 to interact first with the solar radiation after its crossing of the protection layer. This photonic conversion layer has a thickness that ranges between about ten micrometers and one millimeter.

It can be also directly implanted in the upper part of the substrate 8 or inside one or several layers of the substrate 8. It can also be uniformly distributed throughout the thickness of the substrate 8 or in one or several layers of the substrate 8, it is then located primarily in the upper region of this substrate 8 or this or these layer (s) substrate 8.

Conversion or spectral rearrangement concerns ultraviolet light as above-mentioned, but a second photonic converter 14 is scheduled to convert infrared light that energy is mainly wasted in classical photovoltaic cells due to transmission meaning mainly the lack of light-matter interaction in the solar converter.

The spectral conversion can be realized by nanoobjects for example silicon nanocrystals that are absorbing photons having wavelengths related to their size and that are reemitting light with another wavelength more adapted to light-to-electricity converters or photoconverters 4. The term nanocrystals is used hereinfurther to designate all the nanoobjects which are adapted for this application.

To convert the totality of the ultraviolet, the nano-objects, for example, the silicon nanocrystals must have an adapted active geometric characteristic such that, for example, their diameter, which may be determined as ranging from about 2 to 5 nm. To convert the whole of this ultraviolet radiation in the solar spectrum, the average conversion of ultraviolet photon 13 is preferably composed of a mixture of silicon nanocrystals with diameters ranging from 2 to about 5 nm.

Depending on the variant considered, the nanoobjects e.g. the nanocrystals can be used as a mixing or by using successive layers containing nanocrystals of lower diameter for the top that will absorb the shorter wavelength and nanocrystals of bigger diameter for the bottom that will thus absorb the longer wavelengths.

The photonic converter 13 for converting ultraviolet into visible light will operate inside an adapted spectral band. The device can be constituted of excited photoluminescent centers for instance belonging to ions of rare earth and more specifically to ions that are absorbing the ultraviolet photons and reemitting several photons of the visible spectrum for every ultraviolet photon absorbed what can constitute a real photomultiplication.

The excited photoluminescent centers are thus more efficient than the silicon nanocrystals, but they are unfortunately much more expensive. They can be introduced by implantation at the desired depth and with the desired density or directly into the bulk of the substrate 8, or into one layer or layers of the substrate 8, or a special top layer of photonic conversion disposed above the planar support or the substrate 8 or the base layer (s) of 8.

In a preferred variant of the invention, the converting means 13 of photon radiation in an ultraviolet spectral sub-band visible radiation may also be formed of a mixture of silicon nanocrystals and photoluminescent centers excited to combine the advantages of two. With a variant of the invention, the photonic converter 13 of the ultraviolet in a visible light band can be also realized by a mixing of silicon nanocrystals and photoluminescent excited centers to combine both advantages.

For this, the photoluminescent centers are preferably implanted directly in silicon nanocrystals, this implantation may be performed before (pre-implantation) or after formation of the nanocrystals of silicon. Then, the upper layer dedicated to photoconversion is added to substrate 8 or to the substrate layers 8 of the opto-photonic platform 2.

When the upper layer of the photonic photoconversion or the substrate 8 is or are made (s) from glass, the silicon nanocrystals alones or doped with excited electroluminescent centers can be directly mixed to the melt silicate layer used to fabricate these photonics conversion layers as a layer of the glass substrate. For the visible or non-visible infrared light the photonics converter 14 can be located above or under the substrate 8 or one or more layers of substrate 8.

Obviously, the invention is not limited to the preferred embodiments described above and illustrated in the various figures; many modifications can be thought by experts in the fields that can also imagine other variants without departing from the scope of the invention.

The invention claimed is:

1. An opto-electronic unit to be used as a photovoltaic solar sensor, comprising:
   an opto-photonic platform adapted to be exposed to solar radiation and comprising at least one photonic converter and at least one photonic diffraction grating incorporated therein comprising a plurality of diffractive structures, wherein the opto-photonic platform is configured to specifically output radiation wavelengths of spectral sub-bands of the visible range having predetermined widths, wherein the plurality of diffractive structures are slanted relative to a normal of a main plane of the photonic diffraction grating so that respective surfaces of the plurality of diffractive structures are oriented toward the main plane of the photonic diffraction grating, wherein at least one of the plurality of diffractive structures has at least one selected from the group consisting of a different height, a different thickness, a different slant angle, a different position, a different spacing, and a different pitch than at least one other of the plurality of diffractive structures, wherein the plurality of diffractive structures comprise slanted ribs or slanted fringes having height dimensions within a range of from 0.3 to 3 nanometers, and spacings between two adjacent ribs or fringes are within a range of from 100 to 600 nanometers, a light-to-electricity conversion unit operatively associated with said opto-photonic platform comprising a plurality of light-to-electricity converters each having an exposure surface upon which said specifically outputted spectral sub-bands of the visible range, outputted from said opto-photonic platform, are respectively received as incident light flux so as to produce electricity.

2. The opto-electronic unit according to claim 1, wherein the at least one photonic converter comprises a first photonic converter specific for ultraviolet UV radiation and a second photonic converter specific for infrared radiation.

3. The opto-electronic unit according to claim 2, wherein at least one of the first and second photonic converters are located in front of the at least one photonic diffraction grating for dispersing incident light.

4. The opto-electronic unit according to claim 3, wherein said first photonic converter is located in front of the at least one photonic diffraction grating and the second photonic converter is located behind the at least one photonic diffraction grating.

5. The opto-electronic unit according to claim 2, wherein the first photonic converter comprises a plurality of silicon nanocrystals, wherein the plurality of silicon nanocrystals comprises at least two different sizes of silicon nanocrystals.

6. The opto-electronic unit according to claim 5, wherein the plurality of silicon nanocrystals have a diameter ranging from 2 to 5 nanometers that are utilized for absorbing the ultraviolet UV radiation.

7. The opto-electronic unit according to claim 5, wherein the first photonic converter comprises a plurality of layers and the different sized silicon nanocrystals are disposed in separate layers of the plurality of layers.

8. The opto-electronic unit according to claim 3, wherein the first photonic converter comprises excited photoluminescent centers that absorb photons of ultraviolet UV radiation and re-emit photons in the visible range for each energetic photon absorbed.

9. The opto-electronic unit according to claim 8, wherein said excited photoluminescent centers are implanted inside an upper layer of the first photonic converter.

10. The opto-electronic unit according to claim 3, wherein the first and second photonic converters comprise a plurality of silicon nanocrystals and a plurality of excited photoluminescent centers, wherein the plurality of silicon nanocrystals comprises at least two different sizes of silicon nanocrystals, and wherein the plurality of excited photoluminescent centers absorb at least one of ultraviolet UV radiation or infrared radiation and subsequently re-emit photons in the visible spectrum.

11. The opto-electronic unit according to claim 8, wherein the first photonic converter comprises a plurality of silicon nanocrystals.

12. The opto-electronic unit according to claim 11, wherein the plurality of silicon nanocrystals are either un-doped or are doped by the excited photoluminescent centers, and the plurality of silicon nanocrystals and excited photoluminescent centers are disposed in an upper layer of the first photonic converter.

13. The opto-electronic unit according to claim 1, wherein said opto-photonic platform is spaced a predetermined distance from said light-to-electricity conversion unit so as to achieve optimal focalization.

14. The opto-electronic unit according to claim 1, wherein the plurality of diffractive structures are layered upon an incident surface of said light-to-electricity conversion unit and are protected by a transparent layer.

15. The opto-electronic unit according to claim 1, wherein the slanted ribs or slanted fringes are slanted at an angle within the range of 10 to 15 degrees.

16. The opto-electronic unit according to claim 1, wherein the slanted ribs or slanted fringes are separated by valleys so as to create interferences between light reflected by the slanted ribs or slanted fringes and light reflected by the valleys.

17. The opto-electronic unit according to claim 1, wherein each one of said plurality of light-to-electricity converters is optimized for a spectral sub-band belonging to the visible part of the solar light spectrum coming from said opto-photonic platform.

18. The opto-electronic unit according to claim 1, wherein the slanted ribs or slanted fringes are slanted in the same direction and at the same angle.

19. The opto-electronic unit according to claim 1, wherein the slanted ribs or slanted fringes are in the form of elongated strips or having the shape of a parallelogram with sharp edges.

20. The opto-electronic unit according to claim 1, wherein the plurality of diffractive structures are disposed so as to form a repetitive pattern.

\* \* \* \* \*